United States Patent
Li et al.

(10) Patent No.: US 9,368,628 B2
(45) Date of Patent: Jun. 14, 2016

(54) FINFET WITH HIGH MOBILITY AND STRAIN CHANNEL

(75) Inventors: Hou-Ju Li, Hsin-Chu (TW); Kao-Ting Lai, Hsin-Chu (TW); Kuo-Chiang Ting, Hsin-Chu (TW); Chi-Hsi Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 364 days.

(21) Appl. No.: 13/542,468

(22) Filed: Jul. 5, 2012

(65) Prior Publication Data

US 2014/0008736 A1    Jan. 9, 2014

(51) Int. Cl.
*H01L 29/49* (2006.01)
*H01L 29/78* (2006.01)

(52) U.S. Cl.
CPC .......... *H01L 29/7848* (2013.01); *H01L 29/785* (2013.01)

(58) Field of Classification Search
USPC .................................. 257/408, 288, 327, 336
See application file for complete search history.

(56) References Cited

U.S. PATENT DOCUMENTS

| | | | |
|---|---|---|---|
| 7,230,270 B2 * | 6/2007 | Chen et al. ....................... 257/67 |
| 7,241,649 B2 * | 7/2007 | Donze et al. ................... 438/156 |
| 7,265,418 B2 * | 9/2007 | Yun et al. ....................... 257/347 |
| 7,279,430 B2 * | 10/2007 | Chang et al. ................... 438/723 |
| 7,314,787 B2 * | 1/2008 | Yagishita ....................... 438/197 |
| 7,399,690 B2 * | 7/2008 | Kwon ........................... 438/595 |
| 7,456,471 B2 * | 11/2008 | Anderson et al. ............. 257/331 |
| 7,476,578 B1 * | 1/2009 | Cheng et al. ................... 438/154 |
| 7,521,766 B2 * | 4/2009 | Yoon et al. ..................... 257/401 |
| 7,772,074 B2 * | 8/2010 | Ye et al. ........................ 438/299 |
| 8,552,477 B2 * | 10/2013 | Zhu ............................... 257/288 |
| 2002/0053714 A1 | 5/2002 | Lam |
| 2004/0256647 A1 * | 12/2004 | Lee et al. ....................... 257/289 |
| 2005/0255656 A1 * | 11/2005 | Kang et al. ..................... 438/283 |
| 2007/0026615 A1 * | 2/2007 | Goktepeli et al. ............. 438/281 |
| 2007/0122954 A1 * | 5/2007 | Liu et al. ....................... 438/187 |
| 2007/0128782 A1 * | 6/2007 | Liu et al. ....................... 438/187 |
| 2007/0155142 A1 | 7/2007 | Jin et al. |
| 2007/0235818 A1 | 10/2007 | Anderson et al. |
| 2007/0267676 A1 * | 11/2007 | Kim et al. ..................... 257/311 |
| 2008/0265321 A1 * | 10/2008 | Yu et al. ........................ 257/344 |
| 2009/0104739 A1 | 4/2009 | Ye et al. |
| 2009/0273034 A1 | 11/2009 | Woon et al. |
| 2011/0147828 A1 | 6/2011 | Murthy et al. |
| 2011/0227161 A1 * | 9/2011 | Zhu et al. ...................... 257/365 |
| 2012/0074468 A1 | 3/2012 | Yeh et al. |
| 2012/0187486 A1 * | 7/2012 | Goto et al. ..................... 257/347 |
| 2013/0069172 A1 * | 3/2013 | Liao et al. ..................... 257/408 |
| 2013/0134525 A1 * | 5/2013 | Jin ................................ 257/408 |
| 2013/0234203 A1 * | 9/2013 | Tsai et al. ...................... 257/190 |
| 2013/0292781 A1 * | 11/2013 | Chen et al. .................... 257/408 |
| 2014/0252412 A1 * | 9/2014 | Tsai et al. ...................... 257/192 |
| 2014/0264636 A1 * | 9/2014 | Tsai et al. ...................... 257/408 |
| 2014/0273379 A1 * | 9/2014 | Tsai et al. ...................... 438/283 |
| 2014/0319609 A1 * | 10/2014 | Merelle et al. ................ 257/337 |

FOREIGN PATENT DOCUMENTS

JP    2001267413    9/2001
WO   WO 2009/040707   * 4/2009

* cited by examiner

*Primary Examiner* — Michael Shingleton
(74) *Attorney, Agent, or Firm* — Slater Matsil, LLP

(57) ABSTRACT

An integrated circuit device includes a fin having a gate area beneath a gate electrode structure, a source/drain region disposed beyond ends of the fin, and a first conformal layer formed around an embedded portion of the source/drain region. A vertical sidewall of the first conformal layer is oriented parallel to the gate area.

21 Claims, 6 Drawing Sheets

FINFET WITH HIGH MOBILITY AND STRAIN CHANNEL

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate field-effect transistors (MuGFETs) were developed. These devices not only improve areal density, but also improve gate control of the channel.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, multiple gate field-effect transistor (MuGFET) devices.

Figure 1:
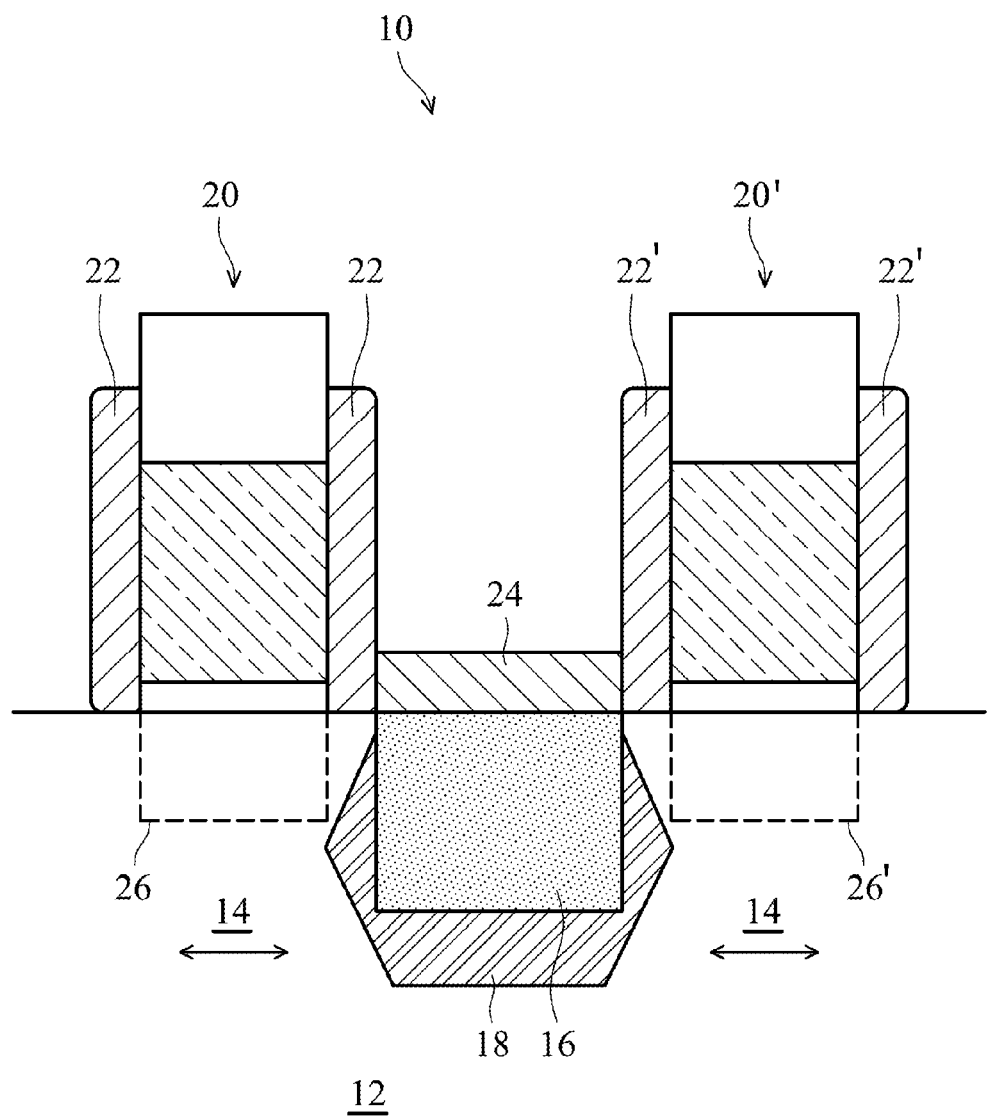
FIG. 1 is a cross section of a representative portion of a conventional FinFET device.

FIG. 1 is a representative portion of a conventional FinFET device 10, which may be referred to as a V-shape tri-layer silicon-germanium (SiGe) device. To provide context, the conventional FinFET device 10 will be briefly described. The FinFET device 10 includes an underlying substrate 12 supporting several fins 14, only one of which is illustrated in FIG. 1 for clarity. The fins 14 generally extend between source/drain regions 16 located proximate opposing ends of the fins 14 (and as shown by the arrows in FIG. 1). For ease of illustration, only a single source/drain region 16 has been depicted in FIG. 1. However, it should be appreciated that a source is formed proximate one end of the illustrated fin 14 and a separate and distinct drain is formed proximate the other end of the illustrated fin 14. As shown in FIG. 1, the source/drain region 16 is formed from a source/drain material (e.g., boron or phosphorous) embedded in a doped semiconductor layer 18.

Still referring to FIG. 1, a gate electrode structure 20, which is disposed between opposing spacers 22, is stacked above the illustrated fin 14 of the FinFET device 10, and another gate electrode structure 20', which is disposed between other opposing spacers 22'. While not shown for ease of illustration, the gate electrode structure 20 of FIG. 1 may include several discrete layers or components such as, for example, a high-k-dielectric layer, an interfacial oxide layer, a metal gate layer, and a silicide layer. In some circumstances, a metal contact 24 may be formed between opposing gate electrode structures 20 and 20'.

As shown in FIG. 1, a gate area 26 (a.k.a., fin gate area) is disposed beneath each gate electrode structure 20, likewise a gate area 26' is disposed beneath each gate electrode structure 20'. The gate area 26 is illustrated by dashed lines in FIG. 1, as is gate area 26'. As evidenced by FIG. 1, when transitioning from two-dimensional architecture (e.g., a planar transistor) to three-dimensional architecture (e.g., FinFETs, MuGFETs), the profile of the semiconductor layer 18 partially surrounding the source/drain region 16 tends to vary through or along the adjacent gate area 26. It has been discovered that this results in different electrical and strain behavior occurring through the gate area 26. Therefore, the conventional FinFET and MuGFET devices become harder to control and have larger variation from device to device.

Figure 2:
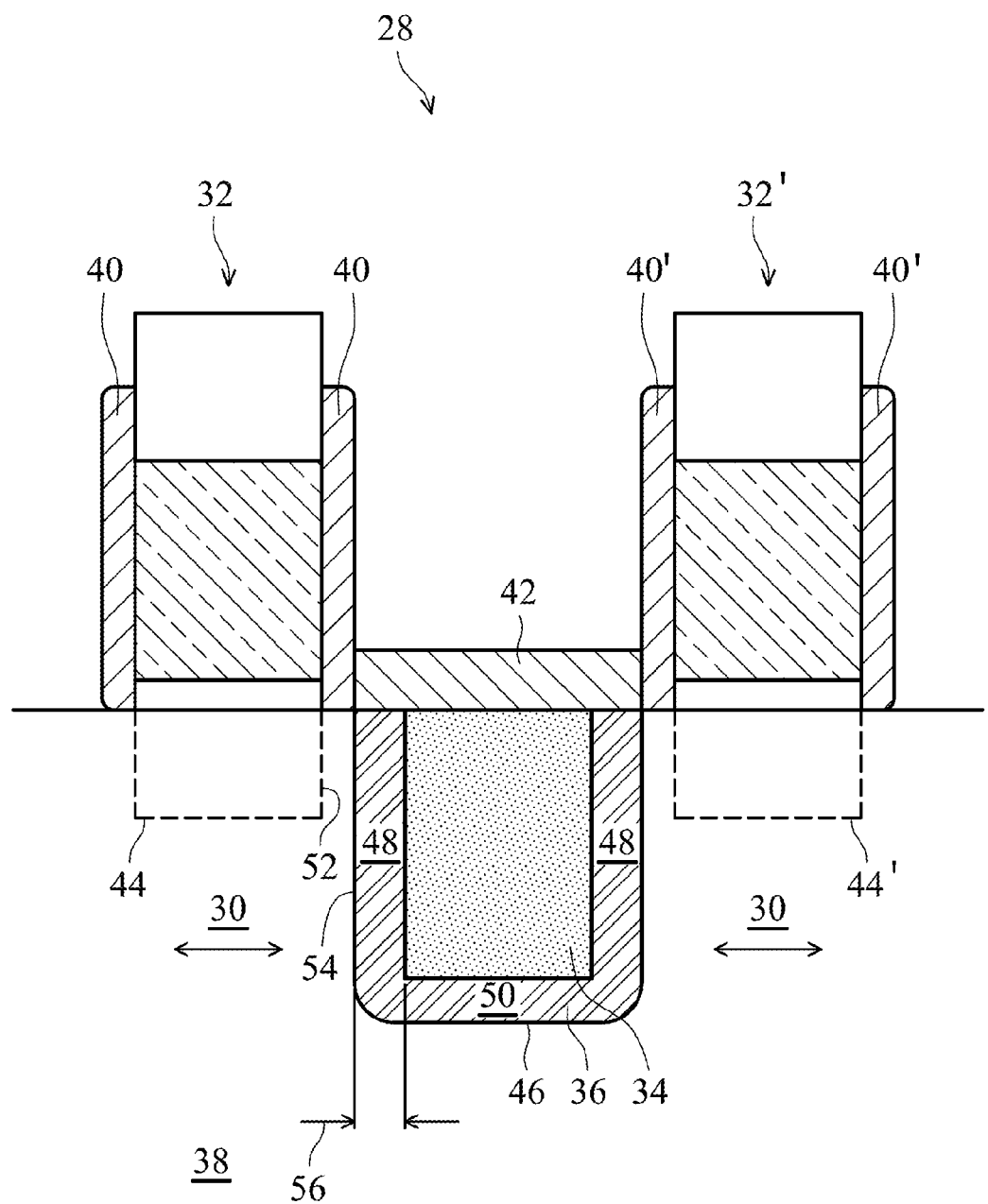
FIG. 2 is a cross section of a representative portion of an embodiment FinFET device having a conformal layer with a sidewall parallel to a gate area of a fin.

Referring now to FIG. 2, an embodiment FinFET device 28 is illustrated. In an embodiment, the FinFET device 28 of FIG. 2 may be referred to as an H-shape tri-layer SiGe device. As will be more fully explained below, the FinFET device 28 provides uniform gate control and strain for three-dimensional transistors. The FinFET device 28 also mitigates or eliminates variation from device to device. As shown in FIG. 2, the FinFET device 10 includes one or more fins 30, only one of which is illustrated for clarity. The FinFET device also includes a gate electrode structure 32 above fin 30, source/drain regions 34, and a first conformal layer 36. Also illustrated in FIG. 2 is another gate electrode structure 32'.

Each fin 30 of the FinFET device 28 is generally supported by an underlying substrate 38, which may be formed from a semiconductor or other suitable material. As shown, each fin 30 is generally disposed beneath one of the gate electrode structures 32. In other words, gate electrode structure 32, which is disposed between opposing spacers 40, is stacked above fin 30 of the FinFET device 28. Also shown are opposing spacers 40' associated with gate electrode structure 32' over fin 30. While not shown for ease of illustration, the gate electrode structures 32 of FIG. 2 may include several discrete layers or components such as, for example, a high-k-dielectric layer, an interfacial oxide layer, a metal gate layer, and a silicide layer. In some circumstances, a metal contact 42 may be formed between opposing gate electrode structures 32 and 32'. A gate area 44, which is generally defined by the gate electrode structure 32, is illustrated in FIG. 2 by dashed lines. Also illustrated is another gate area 44' below gate electrode structure 32'.

Each of the fins 30 generally extends between the source/drain regions 34 located proximate opposing ends of each of the fins 30. In other words, the source/drain regions 34 of the FinFET device 28 are generally disposed beyond ends of the fins 30. For ease of illustration, only a single source/drain region 34 has been depicted in FIG. 2. However, it should be appreciated that a source is formed proximate one end of each fin 30 and a separate and distinct drain is formed proximate the other end of each fin 30. As shown in FIG. 2, the source/drain region 34 is formed from a suitable source/drain material (e.g., boron or phosphorous) embedded in, for example, a first conformal layer 36. In an embodiment, the first conformal layer 36 is a doped or lightly-doped semiconductor material.

The first conformal layer 36 may be formed by, for example, chemical vapor deposition (CVD), atomic layer deposition (ALD), or an epitaxial growth process. The first conformal layer 36 may also be formed by, for example, doping portions of the fin 30 and/or substrate 38 with impurities or by implementing an impurities segregation process. As shown in FIG. 2, the recess 46 occupied by the first conformal layer 36 and the source/drain region 34 may be formed by, for example, dry etch, wet etch, hydrochloric acid (HCl), or an impurities plus etch process.

The first conformal layer 36 is generally formed around an embedded portion of the source/drain region 34. In an embodiment, the first conformal layer 36 is formed over all but a top surface of the source/drain region. Even so, in other embodiments the first conformal layer 36 may be formed over more or less of the source/drain region 34.

Still referring to FIG. 2, the first conformal layer 36 includes vertical sidewalls 48 on either side of, and spaced apart by, a generally horizontal bottom wall 50. As depicted in FIG. 2, the vertical sidewalls 48 are oriented parallel to the adjacent gate area 44. In other words, an exterior surface 52 of each vertical sidewall 48 is parallel to a vertical boundary line 54 of the gate area 44, which is defined by the gate electrode structure 32 located above.

Because the vertical sidewall 48 of the first conformal layer 36 is parallel to the gate area 44 as shown in FIG. 2, the FinFET device 28 generally offers uniform gate control and strain relative to the FinFET device 28 of FIG. 1. Moreover, the first conformal layer 36 mitigates or eliminates undesirable variation from device to device.

In an embodiment, the first conformal layer 36 is able to inhibit dose out-diffusing from the source/drain region. The first conformal layer 36 may also provide either tensile or compressive stress to the gate area 44. In an embodiment, the first conformal layer 36 is lightly-doped silicon and is a lightly doped drain (LDD). In an embodiment, the first conformal layer 36 has a thickness 56 of between about five nanometers (5 nm) and about fifty nanometers (50 nm).

In an embodiment, lightly-doped sidewalls 48 of the FinFET device 28 of FIG. 2 provide enough protection for boron out-diffuse for the lightly doped drain (LDD). In addition, the FinFET device 28 provides a larger SiGe volume and higher strain relative to V-shaped tri-layer and U-shaped tri-layer SiGe devices. Moreover, the FinFET device 28 exhibits less gate oxide damage relative to the V-shaped tri-layer SiGe device.

Figure 3:
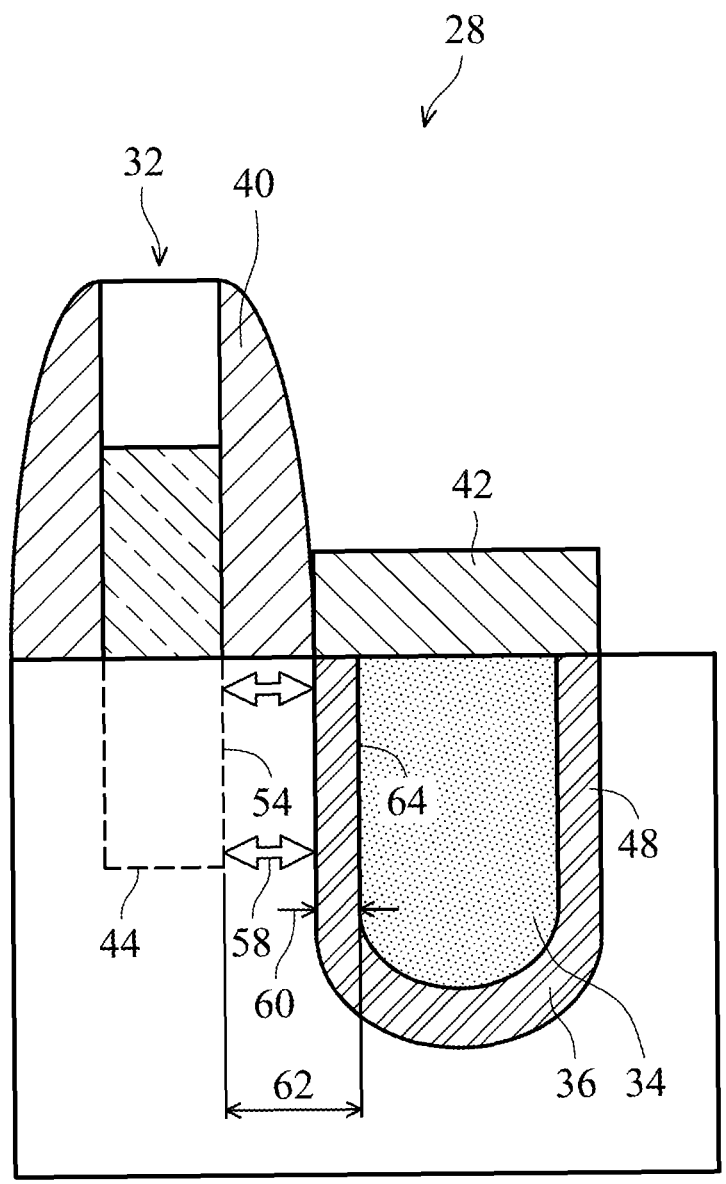
FIG. 3 illustrates an embodiment of the FinFET device of FIG. 2 where the first conformal layer is spaced apart from the gate area by a certain distance.

Referring now to FIG. 3, in an embodiment the first conformal layer 36 is spaced apart from the gate area 44 of the fin 30 by a distance 58 greater than or equal to a thickness 60 of the vertical sidewall 48. In an embodiment, the thickness 60 of the vertical sidewall 48 of the first conformal layer 36 is less than or equal to the distance 62 between the boundary 54 of the gate area 44 and an interface 64 between the first conformal layer 36 and the source/drain region 34.

Figure 4:
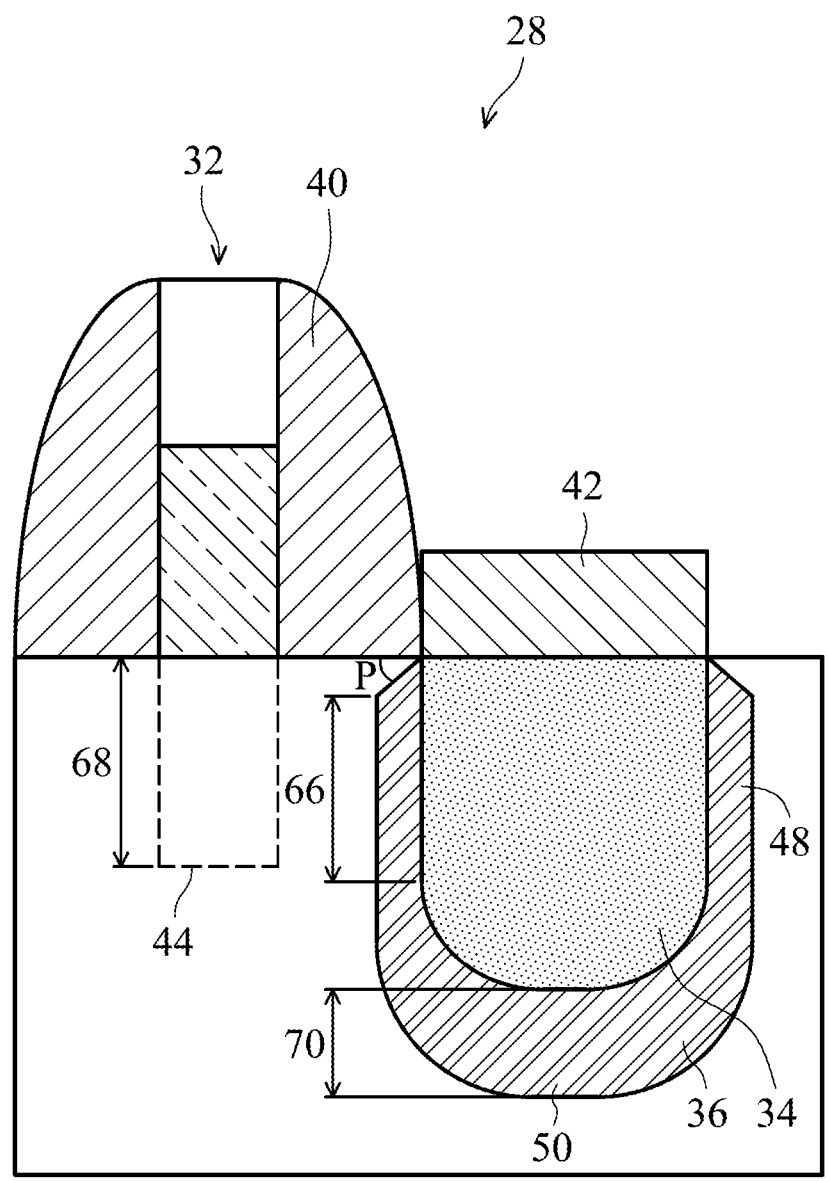
FIG. 4 is illustrates an embodiment of the FinFET device of FIG. 2 having various other dimensions and configurations.

Referring now to FIG. 4, in an embodiment a length 66 of the vertical sidewall 48 of the first conformal layer 36 is greater than or equal to one half of the depth 68 of the gate area 44. As shown in FIG. 4, measurement of the length 66 of the vertical sidewall 48 begins where the vertical sidewall 48 begins having a generally uniform thickness 60. Indeed, in those embodiments where ammonia or other substances are used in forming the recess 46 occupied by the first conformal layer 36 and the source/drain region 34, the upward-facing surface of the vertical sidewall 48 may be angled, as represented by the letter "P" in FIG. 4. In an embodiment, the angle P between the upward-facing surface of the vertical sidewall 48 and the top surface of the fin 30 is seventy degrees or less. As illustrated in FIG. 3, the upward-facing surface of the vertical sidewall 48 may be horizontal. In an embodiment, a thickness 70 of the bottom wall 50 may be greater than the thickness 60 of the vertical sidewall 48.

Figure 5:
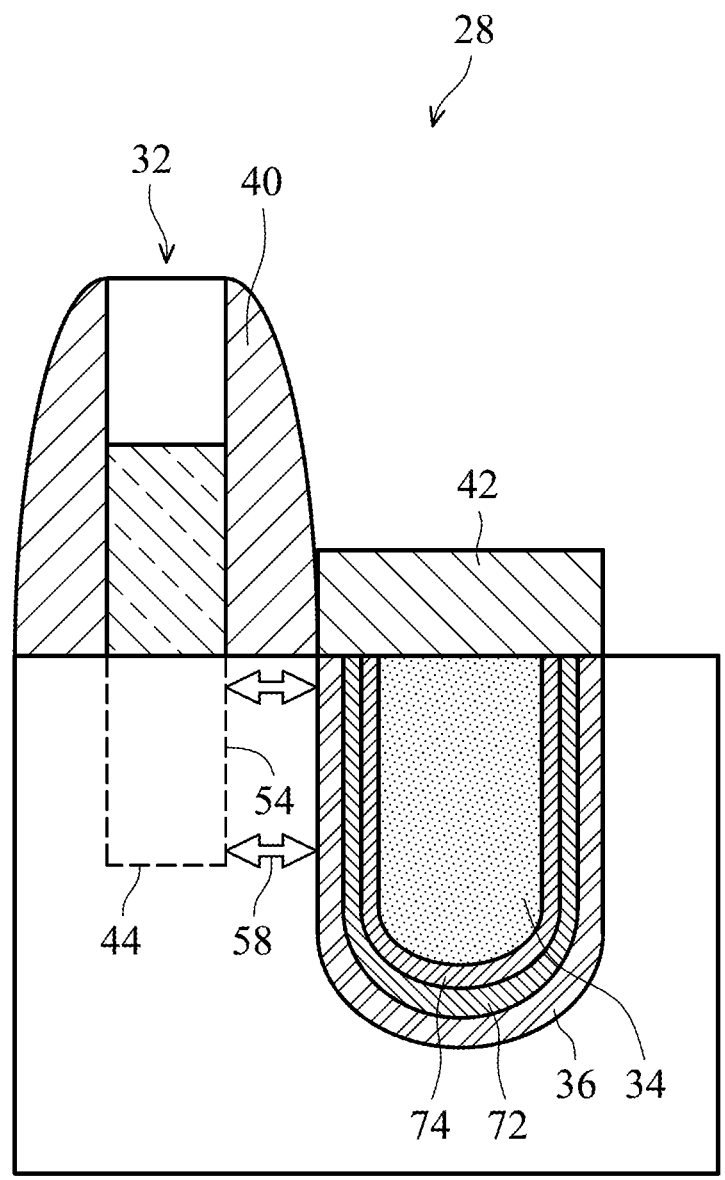
FIG. 5 is a representative portion of an embodiment FinFET device having a plurality of conformal layers.

Referring now to FIG. 5, in an embodiment one or more additional conformal layers are formed. Indeed, a second conformal layer 72 may be formed over the first conformal layer 36. Likewise, a third conformal layer 74 may be formed over the second conformal layer 72. While a total of three conformal layers 36, 72, 74 are depicted in FIG. 5, it should be recognized that more or fewer of the conformal layers may be incorporated into the FinFET device 28.

In an embodiment, the first conformal layer 36 is formed from a different material than one or both of the second and third conformal layers 72, 74. In addition, in an embodiment the first conformal layer 36 may be doped differently or in a different concentration than one or both of the second and third conformal layers 72, 74. As such, a desired gradient doping profile may be generated in the FinFET device 28.

Figure 6:
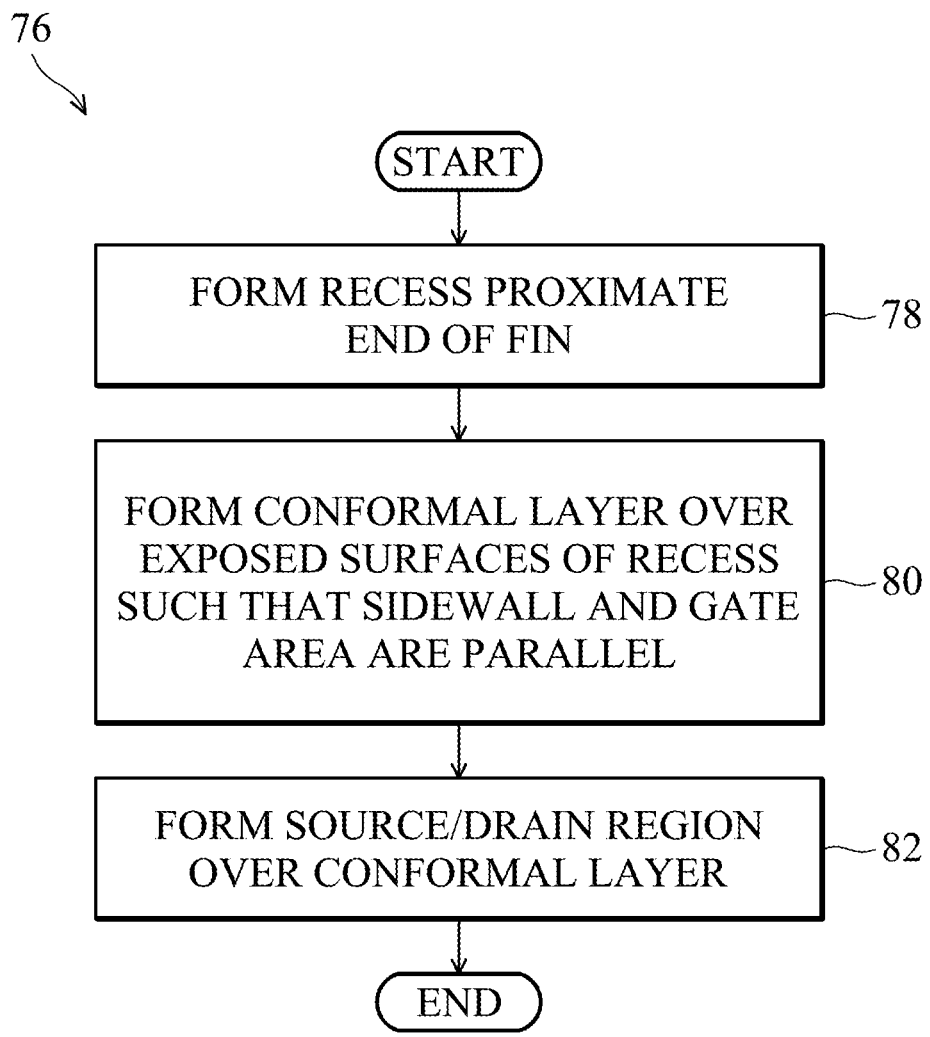
FIG. 6 is an embodiment method of forming the FinFET device of FIG. 2.

Referring now to FIG. 6, a method 76 of forming an integrated circuit device is illustrated. In block 78, a recess is formed proximate an end of the fin 30. As noted above, the gate area of the fin 30 is generally defined by the gate electrode structure 32. In block 80, the first conformal layer 36 is formed over exposed surfaces of the recess 46 such that the vertical sidewall of the first conformal layer 36 is parallel with the gate area 44. In block 82, the source/drain region 34 is formed in the recess over interior surfaces of the first conformal layer 36.

In an embodiment, an integrated circuit device includes a fin having a gate area beneath a gate electrode structure, a source/drain region disposed beyond ends of the fin, and a first conformal layer formed around an embedded portion of the source/drain region, the first conformal layer including a vertical sidewall oriented parallel to the gate area.

In an embodiment, an integrated circuit device includes a fin having a gate area vertically beneath a gate electrode structure, a source/drain region formed beyond ends of the fin and the gate electrode structure, and a first conformal layer formed around an embedded portion of the source/drain region, the first conformal layer including a vertical sidewall with an exterior surface, the exterior surface parallel to a vertical boundary line of the gate area.

In an embodiment, a method of forming an integrated circuit device is provided. The method includes forming a recess proximate an end of a fin, the fin having a gate area beneath a gate electrode structure, forming a first conformal layer over exposed surfaces of the recess, a vertical sidewall of the first conformal layer parallel with the gate area, and forming a source/drain region in the recess over interior surfaces of the first conformal layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device, comprising:
   a fin having a gate area beneath a gate electrode structure, the gate area having a vertical boundary defined by a vertical sidewall surface of the gate electrode structure;
   a source/drain region disposed on a side of the gate area, the source/drain region including a first embedded sidewall proximate the gate area and second embedded sidewall distal the gate area and an embedded bottom; and
   a first conformal layer formed around the first embedded sidewall, the second embedded sidewall and the bottom of the source/drain region, the first conformal layer including a first vertical sidewall proximate the gate area and a second vertical sidewall distal the gate area, the first vertical sidewall having an outermost sidewall surface oriented parallel to the vertical boundary of the gate area.

2. The integrated circuit device of claim 1, wherein a length of the first vertical sidewall of the first conformal layer is equal to or greater than one half of a depth of the gate area.

3. The integrated circuit device of claim 1, wherein a second conformal layer is formed over the first conformal layer.

4. The integrated circuit device of claim 3, wherein the first conformal layer and the second conformal layer each have a different doping to produce a gradient doping profile.

5. The integrated circuit device of claim 1, wherein the first conformal layer has a thickness of between about five nanometers and about fifty nanometers.

6. The integrated circuit device of claim 1, wherein a thickness of the vertical sidewall of the first conformal layer is less than or equal to a distance between a nearest boundary of the gate area and an interface between the first conformal layer and the source/drain region.

7. The integrated circuit device of claim 1, wherein an angle formed between an upper surface of the vertical sidewall of the first conformal layer and an upper surface of the fin is between about zero and about seventy degrees.

8. The integrated circuit device of claim 1, wherein the first conformal layer is configured to inhibit dose out-diffusing from the source/drain region.

9. The integrated circuit device of claim 1, wherein the first conformal layer is configured to provide strain to the gate area.

10. The integrated circuit device of claim 1, wherein the first conformal layer is a lightly doped silicon and the source/drain region comprises a lightly doped drain (LDD).

11. The integrated circuit device of claim 1, wherein the source/drain region is doped with one of phosphorous and boron.

12. An integrated circuit device, comprising:
    a fin having a gate area vertically beneath a gate electrode structure, a vertical boundary line of the gate area being defined by a sidewall surface of the gate electrode structure;
    a source/drain region formed on a side of the gate area; and
    a first conformal layer formed around an embedded portion of the source/drain region, the first conformal layer including a vertical sidewall proximate the gate area and contacting a first sidewall of the source/drain region, the vertical sidewall having an exterior surface, the exterior surface being parallel to the vertical boundary line of the gate area, the conformal layer further including a second vertical sidewall distal the gate area and contacting a second sidewall of the source/drain region, the conformal layer further comprising a bottom portion contacting a bottom portion of the source/drain region.

13. The integrated circuit device of claim 12, wherein a length of the vertical sidewall of the first conformal layer is equal to or greater than one half of a depth of the gate area.

14. The integrated circuit device of claim 12, wherein a second conformal layer is formed over the first conformal layer.

15. The integrated circuit device of claim 14, the first conformal layer and the second conformal layer each have a different doping to produce a gradient dose profile.

16. The integrated circuit device of claim 12, wherein the first conformal layer is spaced apart from the gate area of the fin by at least a thickness of the vertical sidewall of the first conformal layer.

17. The integrated circuit device of claim 12, wherein the first conformal layer is configured to inhibit dose out-diffusing from the source/drain region and to provide strain to the gate area.

18. A method of forming an integrated circuit device, comprising:
    forming a recess proximate a gate area of a fin, the gate area being beneath a gate electrode structure, a vertical boundary of the gate area being defined by a sidewall surface of the gate electrode structure;
    forming a conformal layer over all exposed surfaces of the recess, an outermost sidewall surface of a vertical sidewall of the first conformal layer being parallel with the vertical boundary of the gate area; and
    forming a source/drain region in the recess over interior surfaces of the conformal layer, wherein all surfaces of the source/drain region within the recess are in contact with the conformal layer.

19. The method of claim 18, further comprising forming a length of the vertical sidewall of the conformal layer is equal to or greater than one half of a depth of the gate area.

20. The method of claim 18, further comprising spacing the first conformal layer apart from the gate area of the fin by at least a thickness of the sidewall of the conformal layer.

21. The integrated circuit of claim 1, wherein the first vertical sidewall of the conformal layer is and laterally displaced from the vertical boundary of the gate area.

* * * * *